United States Patent
Xie et al.

(10) Patent No.: US 8,946,793 B2
(45) Date of Patent: Feb. 3, 2015

(54) INTEGRATED CIRCUITS HAVING REPLACEMENT GATE STRUCTURES AND METHODS FOR FABRICATING THE SAME

(71) Applicants: Globalfoundries, Inc., Grand Cayman (KY); International Business Machines Corporation, Armonk, NY (US)

(72) Inventors: Ruilong Xie, Niskayuna, NY (US); Xiuyu Cai, Niskayuna, NY (US); Kangguo Cheng, Schenectady, NY (US); Ali Khakifirooz, Mountain View, CA (US)

(73) Assignees: Globalfoundries, Inc., Grand Cayman (KY); International Business Machines Corporation, Armonk, NY (US)

( * ) Notice: Subject to any disclaimer, the term of this patent is extended or adjusted under 35 U.S.C. 154(b) by 156 days.

(21) Appl. No.: 13/759,209

(22) Filed: Feb. 5, 2013

(65) Prior Publication Data
US 2014/0217482 A1 Aug. 7, 2014

(51) Int. Cl.
*H01L 29/76* (2006.01)
*H01L 29/94* (2006.01)
*H01L 29/40* (2006.01)
*H01L 29/49* (2006.01)

(52) U.S. Cl.
CPC .............. *H01L 29/401* (2013.01); *H01L 29/49* (2013.01)

USPC .......................................... 257/288; 438/478

(58) Field of Classification Search
CPC ............................... H01L 29/401; H01L 29/49
USPC .......................................... 257/288; 438/478
See application file for complete search history.

(56) References Cited

U.S. PATENT DOCUMENTS

2002/0153537 A1* 10/2002 Segawa .......................... 257/202
2011/0127589 A1* 6/2011 Chen et al. ..................... 257/288

* cited by examiner

*Primary Examiner* — Theresa T Doan
(74) *Attorney, Agent, or Firm* — Ingrassia Fisher & Lorenz, P.C.

(57) ABSTRACT

A method of fabricating an integrated circuit includes forming an interlayer dielectric (ILD) layer over a dummy gate stack. The dummy gate stack includes a dummy gate structure, a hardmask layer, and sidewall spacers formed over a semiconductor substrate. The method further includes removing at least an upper portion of the dummy gate stack to form a first opening within the ILD layer, extending the first opening to form a first extended opening by completely removing the dummy gate structure of the dummy gate stack, and depositing at least one workfunction material layer within the first opening and within the first extended opening. Still further, the method includes removing portions of the workfunction material within the first opening and depositing a low-resistance material over remaining portions of the workfunction material thereby forming a replacement metal gate structure that includes the remaining portion of the workfunction material and the low-resistance material.

16 Claims, 7 Drawing Sheets

INTEGRATED CIRCUITS HAVING REPLACEMENT GATE STRUCTURES AND METHODS FOR FABRICATING THE SAME

TECHNICAL FIELD

Embodiments of the subject matter described herein relate generally to integrated circuits and methods for fabricating integrated circuits. More particularly, the subject matter relates to integrated circuits and methods for fabricating integrated circuits having replacement gate structures.

BACKGROUND

The integration of hundreds of millions of circuit elements, such as transistors, on a single integrated circuit necessitates further dramatic scaling down or micro-miniaturization of the physical dimensions of circuit elements, including interconnection structures. Micro-miniaturization has engendered a dramatic increase in transistor engineering complexity, such as the inclusion of lightly-doped drain structures, multiple implants for source/drain regions, silicidation of gates and source/drains, and multiple sidewall spacers, for example.

The drive for high performance requires high-speed operation of microelectronic components requiring high drive currents in addition to low leakage, i.e., low off-state current, to reduce power consumption. Typically, the structural and doping parameters tending to provide a desired increase in drive current of the transistor adversely impact leakage current.

Metal gate electrodes have evolved for improving the drive current by reducing polysilicon depletion. However, simply replacing polysilicon gate electrodes with metal gate electrodes may engender issues in forming the metal gate electrode prior to high-temperature annealing to activate the source/drain implants, such as at temperatures in excess of 900° C. Such fabrication techniques may degrade the metal gate electrode or cause interaction with the gate dielectric, thereby adversely impacting transistor performance.

Replacement gate techniques have been developed to address problems attendant upon substituting metal gate electrodes for polysilicon gate electrodes. For example, a polysilicon gate is used during initial processing until high temperature annealing to activate source/drain implants has been implemented. Subsequently, the polysilicon is removed and replaced with a metal gate.

Additional issues arise with lateral scaling, such as the formation of contacts. For example, once the contacted gate pitch gets to about 64 nanometers (nm), there is not enough room to land a contact between the gate lines and still maintain reliable electrical isolation properties between the gate line and the contact. Self-aligned contact (SAC) methodology has been developed to address this problem. Conventional SAC approaches involve recessing the replacement metal gate structure, which includes both workfunction metal liners (e.g. TiN, TaN, TaC, TiC, TiAlN, etc.) and a conducting metal (e.g., W, Al, etc.), followed by a dielectric cap material deposition and chemical mechanical planarization (CMP). However, to set the correct workfunction for the device, sometimes thick work function metal liners are required (e.g., a combination of different metals such as TiN, TiC, TaC, TiC, or TiAlN with a total thickness of more than 7 nm). As gate length continues to scale down, for example for sub-15 nm gates, the replacement gate structure is so narrow that it will be "pinched-off" by the work function metal liners alone, with little or no space remaining for the lower-resistance gate metal. This will cause high resistance issue for devices with small gate lengths, and will also cause problems in the SAC replacement gate metal recess.

Accordingly, it is desirable to provide methods for the fabrication of integrated circuits that integrate both metal replacement gates and self-aligned contacts with workfunction metal liner compatibility. Furthermore, other desirable features and characteristics of the present invention will become apparent from the subsequent detailed description of the invention and the appended claims, taken in conjunction with the accompanying drawings, the brief summary, and this background of the invention.

BRIEF SUMMARY

Methods of manufacturing integrated circuits having replacement metal gate structures, and the integrated circuits formed thereby, are disclosed herein. In accordance with an exemplary embodiment, a method of fabricating an integrated circuit includes the steps of forming an interlayer dielectric (ILD) layer over a dummy gate stack. The dummy gate stack is formed over a semiconductor substrate. The dummy gate stack includes a dummy gate structure, a hardmask disposed over the dummy gate structure, and sidewall spacers disposed along sides of the dummy gate structure and the hardmask. The method further includes removing at least an upper portion of the dummy gate stack to form a first opening within the ILD layer, forming a thin liner along the ILD layer within the first opening, extending the first opening to form a first extended opening by completely removing the dummy gate structure of the dummy gate stack, thereby exposing a portion of the semiconductor substrate, and depositing at least one workfunction material layer within the first opening and within the first extended opening. Still further, the method includes removing portions of the workfunction material within the first opening and depositing a low-resistance material over a remaining portion of the workfunction material thereby forming a replacement metal gate structure that includes the remaining portion of the workfunction material and the low-resistance material.

In accordance with another exemplary embodiment, an integrated circuit includes a semiconductor substrate and first and second sidewall spacers formed over the semiconductor substrate. The first and second sidewall spacers have a first height and are separated from one another by a space. The integrated circuit further includes at least one layer of a workfunction material disposed in the space. The at least one layer of the workfunction material is deposited to a second height that is at least as high as the first height. Still further, the integrated circuit includes a low-resistance material formed over the at least one layer of the workfunction material.

In accordance with yet another exemplary embodiment, a method of fabricating an integrated circuit includes forming an interlayer dielectric (ILD) layer over a dummy gate stack. The dummy gate stack is formed over a semiconductor substrate and a dummy oxide layer is formed over the semiconductor substrate. The dummy gate stack includes a dummy gate structure, a hardmask disposed over the dummy gate structure, and sidewall spacers disposed along sides of the dummy gate structure and the hardmask and over the dummy oxide layer. The method further includes removing at least an upper portion of the dummy gate stack to form a first opening within the ILD layer. This step of removing at least the upper portion includes removing the hardmask and portions of the sidewall spacers adjacent to the hardmask. The method further includes forming a thin silicon nitride liner along the ILD layer within the first opening, extending the first opening to form a first extended opening by completely removing the dummy gate structure of the dummy gate stack and a portion of the dummy oxide layer disposed thereunder, thereby exposing a portion of the semiconductor substrate, and depositing a layer of a first workfunction material and a layer of a second workfunction material within the first opening and within the first extended opening. Still further, the method includes depositing an organic planarization layer within the first opening, removing portions of the first and second workfunction material layers within the first opening, using the organic planarization layer as an etch mask, removing the organic planarization layer, re-forming a portion of the sidewall spacers, and depositing a low-resistance tungsten material over a remaining portion of the workfunction material layers and in between the re-formed portion of the sidewall spacers, thereby forming a replacement metal gate structure that includes the remaining portion of the workfunction material and the low-resistance material. The method optionally includes forming a capping layer over the replacement metal gate structure.

This brief summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary, or the following detailed description.

For the sake of brevity, conventional techniques related to semiconductor device fabrication are not described in detail herein. Moreover, the various tasks and process steps described herein may be incorporated into a more comprehensive procedure or process having additional steps or functionality not described in detail herein. In particular, various steps in the manufacture of semiconductor-based integrated circuits are well known and so, in the interest of brevity, many conventional steps are only mentioned briefly herein or will be omitted entirely without providing the well-known process details.

The techniques and technologies described herein are utilized to fabricate MOS integrated circuit devices, including nMOS integrated circuit devices, pMOS integrated circuit devices, and cMOS integrated circuit devices. In particular, the process steps described herein are utilized in conjunction with any semiconductor device fabrication process that forms gate structures for integrated circuits, including both planar and non-planar integrated circuits. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor substrate.

Figure 1:
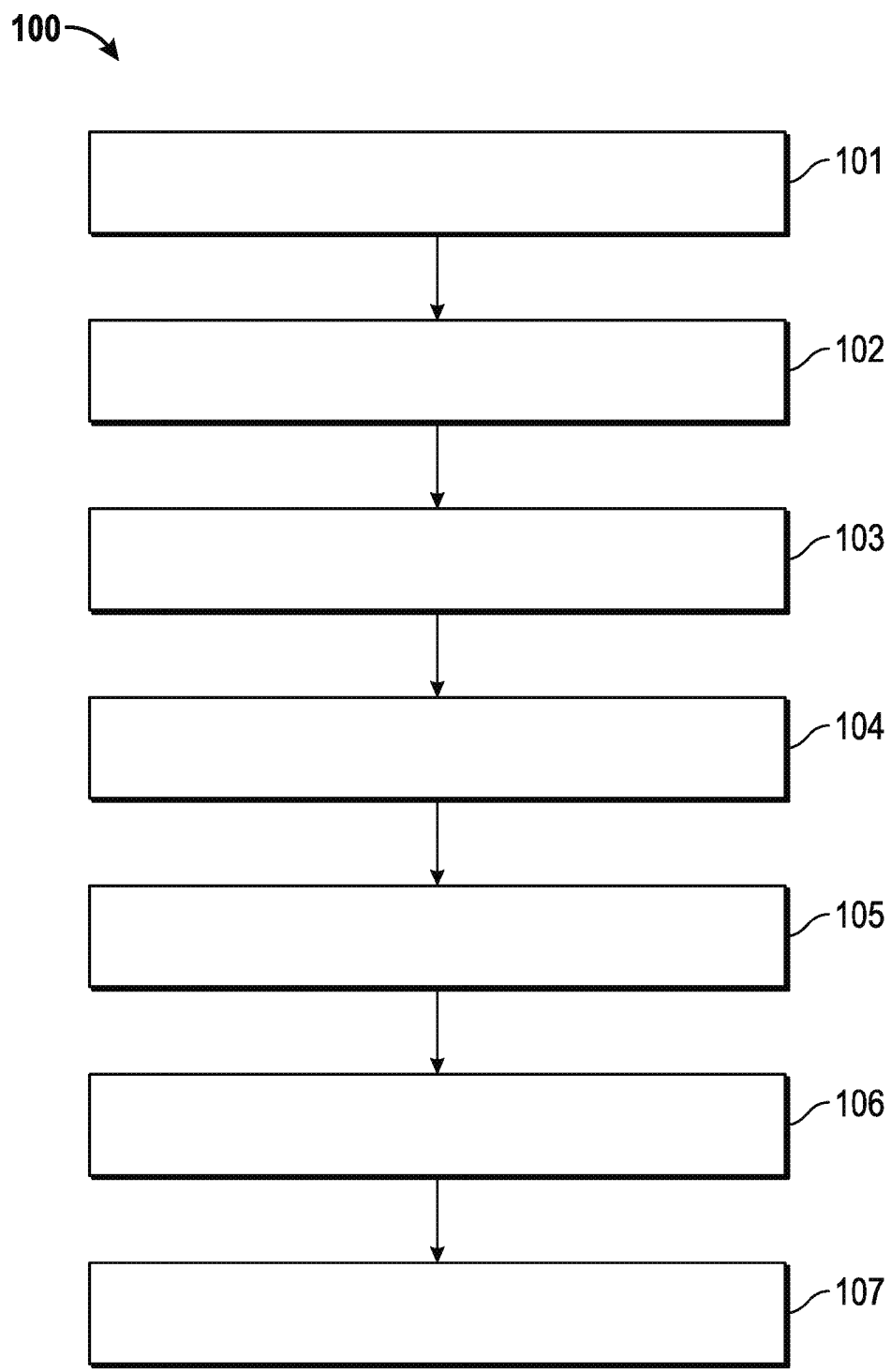
FIG. 1 is a flowchart illustrating a method for fabricating an integrated circuit having a replacement gate structure in accordance with one embodiment of the present disclosure.

An exemplary method 100 for fabricating a MOS integrated circuit in accordance with one embodiment of the present disclosure is set forth in FIG. 1. The various method steps (101-107) of method 100 in FIG. 1 will be discussed in greater detail below, with accompanying reference to the cross-sectional illustrations of a partially-formed integrated circuit in FIGS. 2-13.

A first step 101 in the exemplary method 100 includes forming an interlayer dielectric (ILD) layer over a "dummy gate" stack. With accompanying reference to FIG. 2, in one embodiment, depicted is a cross-sectional view of a partially-formed integrated circuit (IC) prior to forming the replacement gate structure thereon. The partially-formed IC includes a semiconductor substrate 201. As used herein, the term "semiconductor substrate" is used to encompass semiconductor materials conventionally used in the semiconductor industry from which to make electrical devices. "Semiconductor materials" include monocrystalline silicon materials, such as the relatively pure or impurity-doped monocrystalline silicon materials typically used in the semiconductor industry, as well as polycrystalline silicon materials, and silicon admixed with other elements such as germanium, carbon, and the like. In addition, "semiconductor materials" encompass other materials such as relatively pure and impurity-doped germanium, gallium arsenide and other III-V compounds, zinc oxide, glass, and the like. Also, the substrate 201 can be a planar substrate such as bulk Si, SOL or a 3D substrate that includes FINs or nanowires.

Figure 2:
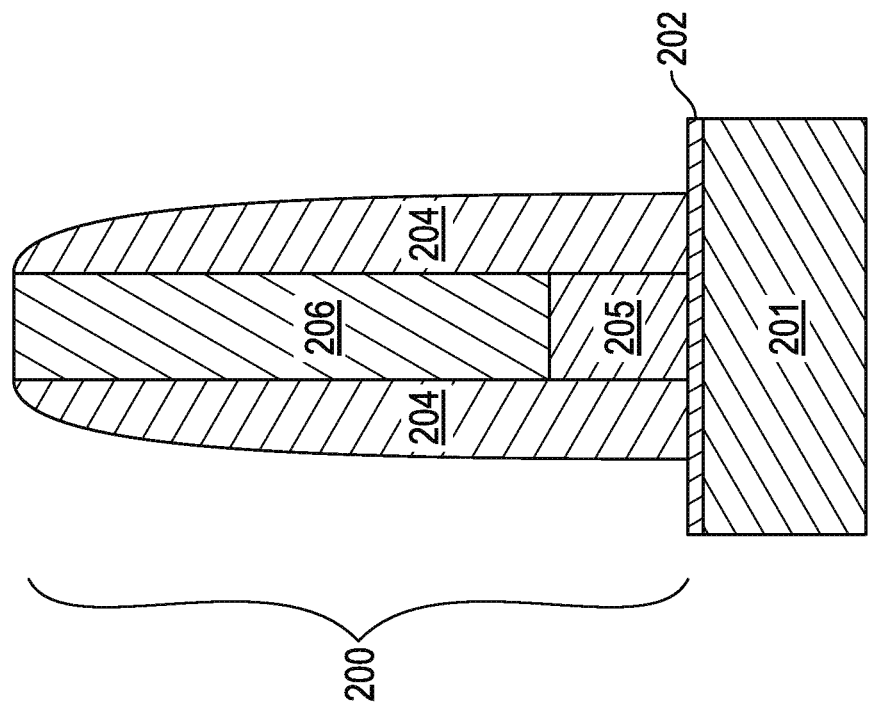

The semiconductor substrate 201 shown in FIG. 2 includes a thin (i.e., less than 5 nm thick) insulating silicon oxide layer 202 disposed over the surface of the semiconductor substrate 201. The silicon oxide layer 202 is provided as a "dummy" layer to facilitate the deposition of subsequent intermediate layers in the formation of the replacement metal gate structure thereon, and which is eventually removed (in part) prior to the formation of the replacement gate materials, as will be discussed in greater detail below.

Above the semiconductor substrate 201 and the silicon oxide layer 202 is provided a "dummy gate" stack 200. The dummy gate stack 200 includes a "dummy" polycrystalline silicon gate structure 205 that is capped by a hardmask 206. The hardmask 206 is formed of, for example, various types of materials including, silicon oxynitride, amorphous silicon, silicon oxide, silicon nitride, and the like. On a relative basis, the dummy gate structure 205 is thinner than the hardmask 206. For example, as shown in FIG. 2, the hardmask 206 is preferably about 2 to about 5 times as thick as the dummy gate structure 205. In one embodiment, the dummy gate structure 205 is about 10 nm to about 50 nm thick, and the hardmask 206 is about 30 nm to about 200 nm thick. The dummy gate stack 200 further includes sidewall spacers 204, which are present on either side of the dummy gate structure 205 and the hardmask 206. The sidewall spacers 204 are formed from a spacer-forming layer, which itself is formed via the blanket deposition of silicon nitride, silicon oxide, or another suitable dielectric material. The spacer-forming layer is next subjected to a series of etching steps to form sidewall spacers 204. For example, an anisotropic or directional etch is performed to remove selected portions of the spacer-forming layer to thereby create sidewall spacers 204 adjacent opposing sides of the dummy gate structure 205 and the hardmask 206. The space between the formed sidewall spacers 204, and thus the width of the dummy gate structure 205 and the hardmask 206, in an embodiment, is between about 10 nm and about 30 nm. Source/drain regions 207 are also provided, as is known in the art.

As such, FIG. 2 depicts the partially-formed IC at a stage in the replacement gate forming process, prior to the deposition of any high-k, barrier, or replacement gate fill material, that is conventional and well-known in the so-called "gate last" technological arts related to ICs. As such, greater details regarding the patterning and formation of the silicon oxide layer 202, the dummy gate stack 200, and the formation of the sidewall spacers 204 need not be provided.

Figure 3:
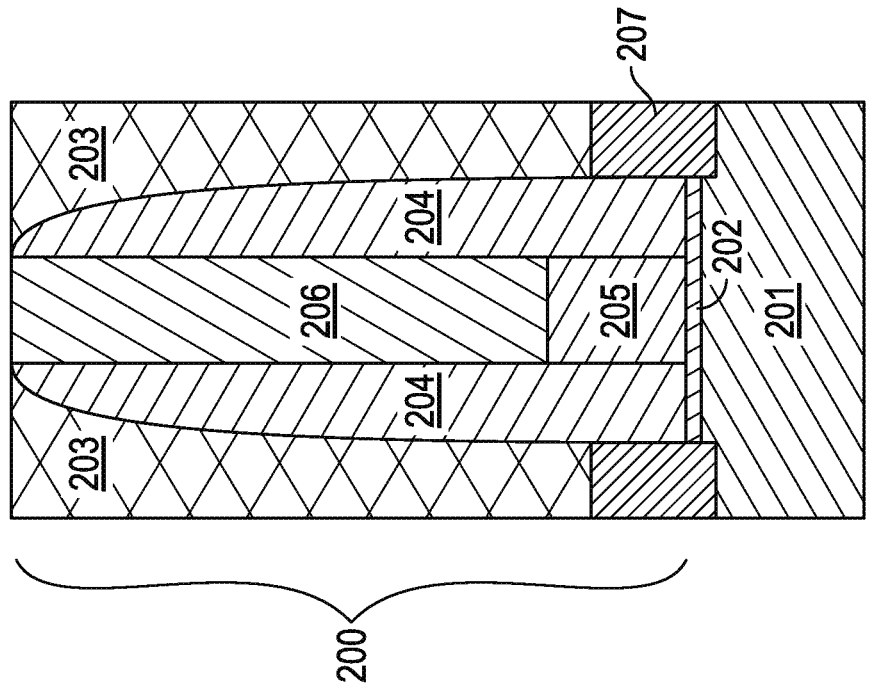
FIGS. 2-13 are partial cross-sectional views of a partially-formed integrated circuit illustrating certain aspects of the method of FIG. 1 for fabricating an integrated circuit having a replacement gate structure.

With reference now to FIG. 3, an inter-layer dielectric (ILD) layer 203 is formed overlying the substrate 201, the dummy silicon oxide layer 202, and the dummy gate stack 200. ILD layer 203 may include a deposited silicon oxide, silicon nitride, or silicon oxynitride, or another material suitable for providing electrical isolation between semiconductive transistor structures. ILD layer 203 may be blanket-deposited using, for example, a PECVD, a low pressure chemical vapor deposition (LPCVD), or a CVD process. In one embodiment, ILD layer 203 includes a silicon oxide material and has a thickness (between oxide layer 202 and the top of ILD layer 203) of about 50 nm to about 1 micron, for example a thickness of about 100 nm to about 500 nm.

Method 100 continues with step 102, which includes removing at least an upper portion of the dummy gate stack to form a first opening within the ILD layer. As further shown in FIG. 4, a portion of the ILD layer 203, a portion of the sidewall spacers 204, and a portion of the hardmask 206 are removed using a suitable etching or planarization technique. The hardmask 206 functions as an etch-stop for the etching or planarization step, such that only a portion of the hardmask 206 is removed. In one example, the partially formed IC is planarized using chemical mechanical planarization (CMP), wherein the ILD layer 203 is exposed to an abrasive and corrosive chemical slurry (commonly a colloid) in conjunction with a polishing pad. About 10 nm to about 40 nm of the sidewall spacers 204 and hardmask 206 are removed (depending on the original thicknesses thereof) due to the CMP step with the hardmask 206 functioning as the etch stop.

Figure 5:
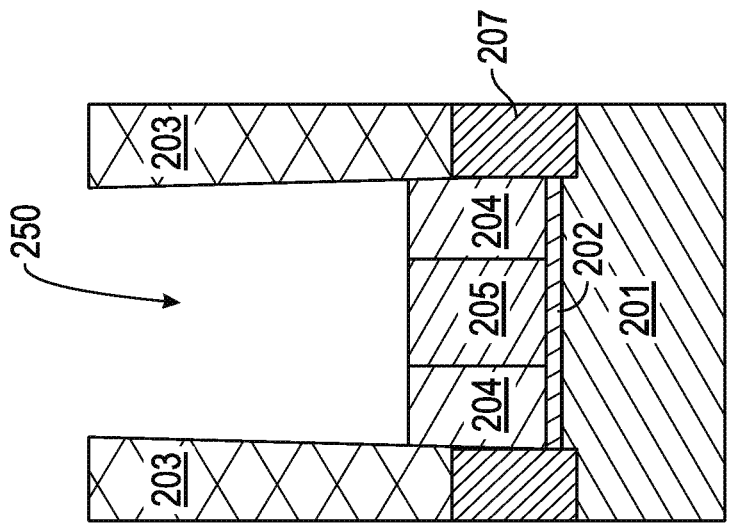
Figure 4:
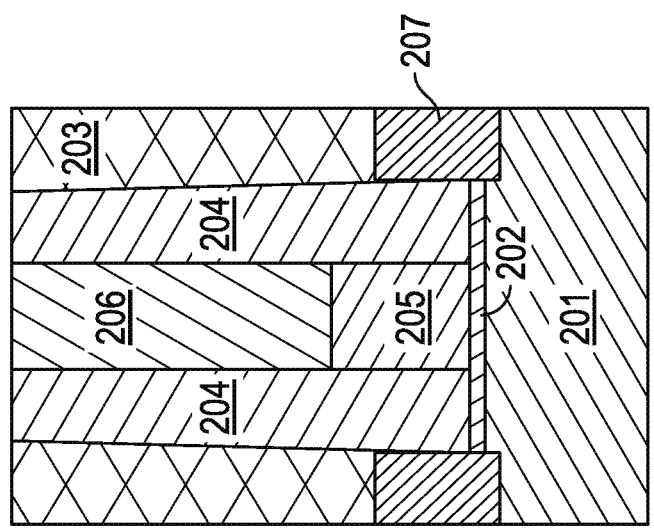

With reference now to FIG. 5, the remaining portion of the hardmask 206 and a portion of the sidewall spacers 204 adjacent thereto are etched using an etch chemistry that is selective to both the hardmask 206 and the sidewall spacers 204, thus forming a first opening 250 within ILD layer 203 (alternatively, two separate etch steps may be employed). For example, in embodiments as described herein where the sidewall spacers 204 and/or the hardmask 206 are formed of a silicon nitride material, a suitable etching technique includes the application of hot phosphoric acid, or a selective SiN plasma dry etch. The dummy polysilicon gate structure 205 functions as an etch-stop for this etching step. As hot phosphoric acid selectively etches silicon nitride over silicon oxide (of which, as noted above, the ILD layer 203 may be formed), the first opening 250 is formed within ILD layer 203 upon the etching of the hardmask 206 and the sidewall spacers 204.

Figure 6:
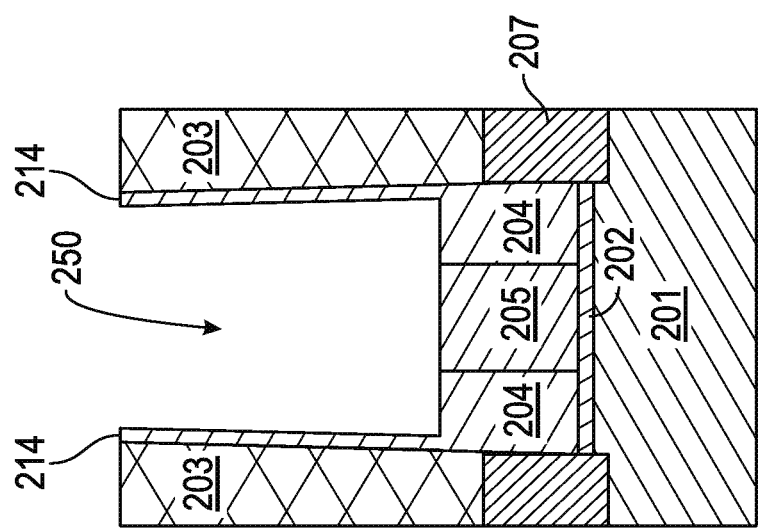
Figure 9:
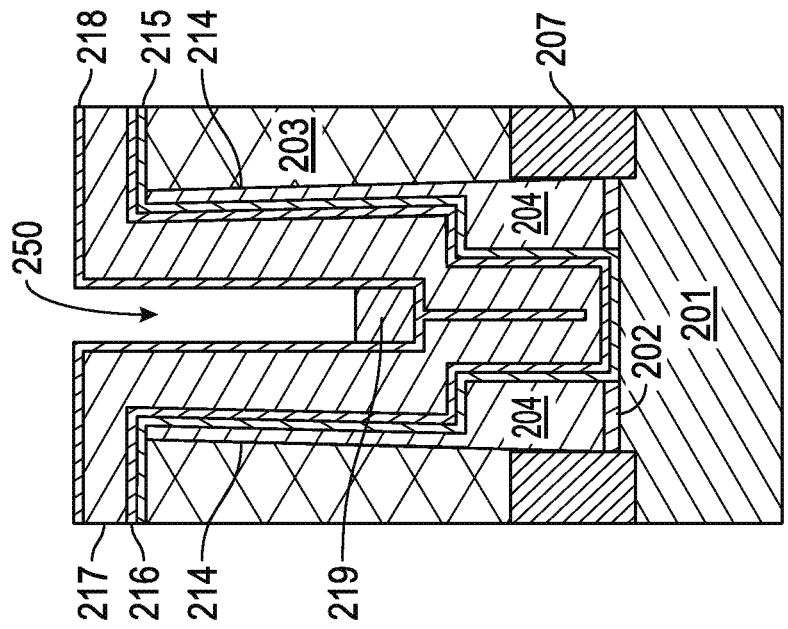

Method 100 continues with a step 103 including forming a thin liner along the ILD sidewalls of the first opening. As shown in FIG. 6 a thin (i.e., less than about 5 nm) layer 214 of silicon nitride or other suitable insulating liner material is conformally deposited within the first opening 250. Layer 214 may be conformally deposited using, for example, a PECVD, a low pressure chemical vapor deposition (LPCVD), a CVD process, or an ALD process. Thereafter, an anisotropic etch is applied within the first opening 250, such that only the horizontal surface of the layer 214 (i.e., the portion of the surface of layer 214 that is not adjacent to ILD layer 203) is etched. This etch may be performed by, for example, plasma or reactive ion etching (RIE) using chemistries based upon carbon trifluoride/oxygen ($CHF_3/O_2$) to etch the layer 214 in examples where the layer 214 is formed of silicon nitride. The resulting structure, as illustrated in FIG. 6, includes a thin silicon nitride layer 214 along the walls of ILD layer 203 within the first opening 250, but not over the remaining portions of sidewall spacers 204 or the dummy gate structure 205.

Figure 7:
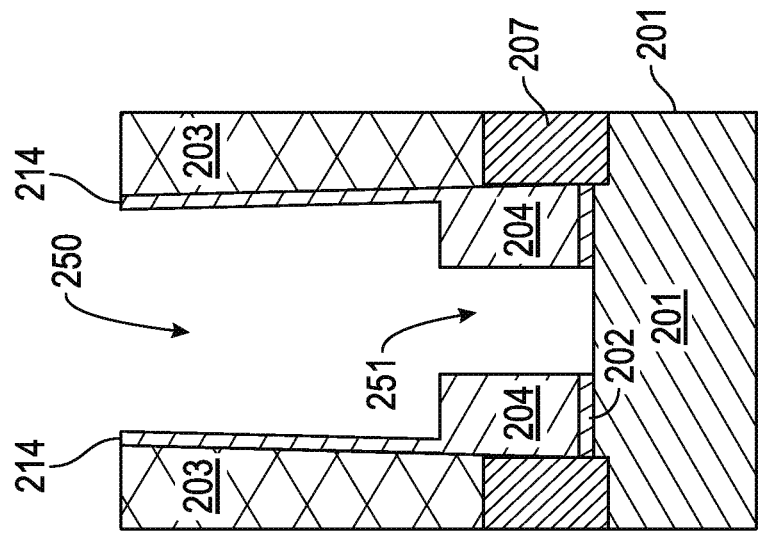

Method 100 continues with a step 104 of extending the first opening. As shown in FIG. 7, the first opening 250 is extended downward by etching the dummy gate structure 205 and the dummy silicon oxide layer 202 thereunder. This etch may be performed by, for example, an etchant gas containing chlorine or HBr or using wet chemistry such as hot ammonia to anisotropically etch the polysilicon dummy gate structure 205. Other suitable etchant chemistries and conditions for anisotropically etching polysilicon are well known in the art. The resultant first extended portion 251 of the first opening 250 extends all the way to the substrate 201, thus exposing a portion of the substrate 201. The depth of the first extended portion 251 is between about 10 nm and about 50 nm (the distance between the exposed surface of substrate 201 at the top surface of the remaining portions of sidewall spacers 204), depending on the original thickness of the dummy gate structure 205. The width of the first extended portion 251 is between about 10 nm and about 30 nm, again depending on the original width of the dummy gate structure 205. The remaining portions of the sidewall spacers 204 and the layer 214 are not etched in this step, and thus they remain as illustrated in FIG. 7. In an alternate embodiment, layer 214 can be removed prior to the deposition of the workfunction materials (using, for example, an HF etch chemistry where the layer 214 is formed of silicon nitride), as is described in greater detail below with regard to FIG. 8.

The method 100 continues with a step 105 of forming the workfunction material layers of the replacement gate structure. With accompanying reference now to FIG. 8, a high-k material layer 215 is first deposited as a barrier layer to prevent electrical leakage from the replacement metal gate to be deposited. The high-k material layer 215 can include a hafnium (Hf) or Zirconium (Zr) oxide, or any other metal oxide with a sufficiently high dielectric constant as are well-known in the art. In an exemplary embodiment, the high-k material for layer 215 is $HfO_2$. The high-k material layer 215 can be deposited by any technique known in the art that provides for conformal deposition thereof in the first opening 250 and in the first extended portion 251. In one embodiment, the high-k material layer 215 is deposited using atomic layer deposition (ALD).

Figure 8:
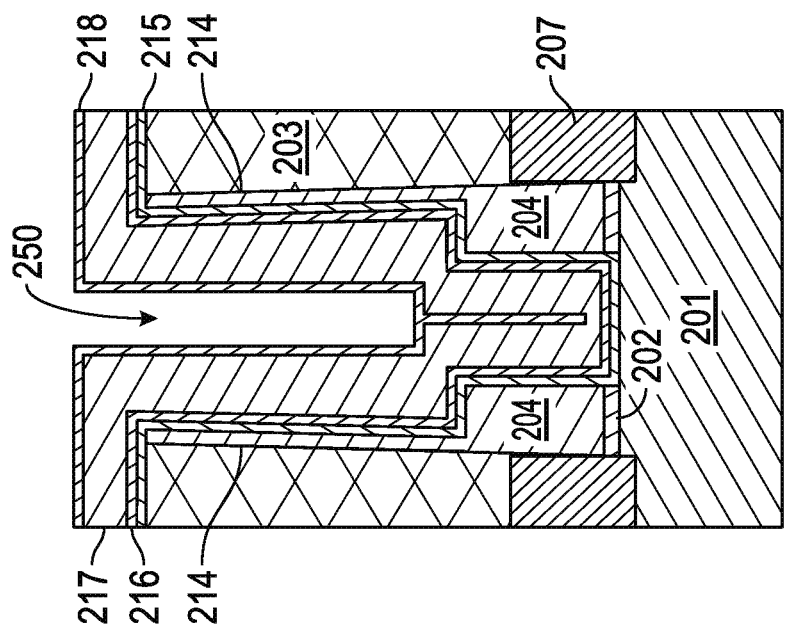

As further shown in FIG. 8, one or more workfunction material layers are deposited, patterned, and etched over the high-k layer 215. In the particular embodiment, shown in FIG. 8, two separate workfunction materials are shown being deposited over the high-k layer 215, including a first layer 216 of a first workfunction material, a first layer 217 of a second workfunction material deposited over the first layer 216 of the first workfunction material, and a second layer 218 of the first workfunction material deposited of the first layer 217 of the second workfunction material. In this embodiment, the first extended portion 251 is completely filled by the high-k layer 215 and the workfunction material layers 216-218. Further, a portion of the first opening (above the first extended portion 251) is filled by the high-k layer 215 and the workfunction material layers 216-218, particularly along the sidewalls thereof (i.e., along the thin layer 214, if it has not been previously removed) and above the remaining portions of the sidewall spacers 204. A portion of the first opening 250 remains open, as illustrated in FIG. 8. In other embodiments, only a single workfunction material layer is deposited to line the first portion 250 and the first extended portion 251. Various workfunction materials, provided in various layers, are known in the art, and the present disclosure is not intended to be limited to any workfunction material or any number of layers of workfunction materials. Further, with regard to any embodiment, it will be appreciated that the workfunction metal layers (e.g., 216-218) should be provided at a sufficient thickness so as to set the correct threshold voltage ($V_t$). For example, for the fabrication of an nFET, the workfunction metal should be about 7 nm to about 10 nm thick, such that the first extended opening 251 is completely filled and at least a portion of the first opening 250 remains open (unfilled).

In one example, the IC to be formed can be of the n-type, i.e., an nFET. As such, at least one of the first or second workfunction materials is an n-type workfunction material. Any material that is on the n-side of the band-gap, and can be deposited using a process that provides for conformal deposition, can be employed as the workfunction material. For example CVD may be used for the deposition of such material. In one embodiment, the n-type workfunction material is TaC. TaC has a workfunction of 4.1 electron volts (eV), and is suitable for use in a CVD process. Of course, many other n-type workfunction materials can be used. These include, but are not limited to, Ti, Y, Mn, and Er. In another example, the IC to be formed can be of the p-type, i.e., a pFET. As such, at least one of the first or second workfunction materials is a p-type workfunction material. Any material that is on the p-side of the band-gap, and can be deposited using a process that provides for conformal deposition, for example ALD, may be used for the workfunction material. In one embodiment, the p-type workfunction material is TiN. TiN has a workfunction of 5.2 eV, and is suitable for use in an ALD processes. Of course, many other p-type workfunction materials can be used. These include, but are not limited to, Pt, Ir, and Ni.

In a particular implementation, by way of example only, the workfunction layers 216-218 are provided as follows: Layer 216 is a layer of TiN that is deposited to a thickness of about 1 nm to about 2 nm, for example about 1 nm. Layer 217 is a layer of TiC that is deposited to a thickness of about 3 nm to about 7 nm, for example about 5 nm. Further, layer 218 is a layer of TiN that is deposited to a thickness of about 1 nm to about 2 nm, for example about 1 nm. However, layer 218 is referred to as a "capping" layer, and can be provided to any thickness that is sufficient to fill any open portion of the first extended portion 251 remaining after the deposition of layers 215-217.

The method 100 continues with a step 106 of forming the replacement metal gate. Referring now to accompanying FIG. 9, a sacrificial gap fill material 219, which in one embodiment can be an organic planarization layer (OPL) or an oxide material, is formed overlying the second layer 218 of the first workfunction material (or other workfunction layer in other embodiments). The gap fill material could overfill the remaining open portion of the first opening 250, followed by planarization and recess, such that only bottom portion of the opening 250 is filled with sacrificial material 219, and top portion of workfunction metal is exposed (e.g., a top portion of layer 218). The sacrificial gap fill material layer 219 may be formed of known OPL materials, such as various organic polymers, or the oxide material can be spin on oxide or flowable oxide.

Figure 10:
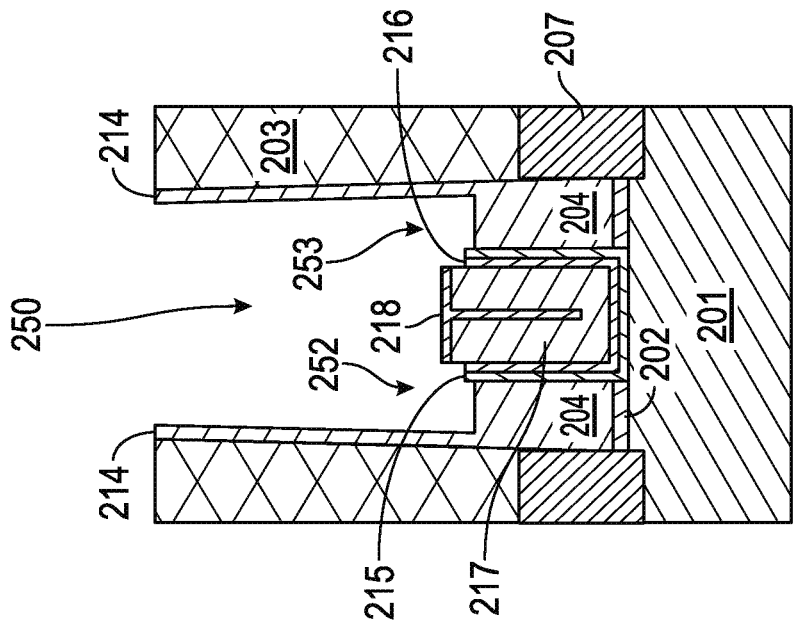

Following the deposition and etching of the sacrificial layer 219, as illustrated in FIG. 10, the workfunction material layers 216-218 are removed everywhere except for a portion thereof disposed directly below the remaining sacrificial gap fill material layer 219. That is, sacrificial gap fill material layer 219 acts as a mask to prevent the etching of the layers 216-218 disposed therebelow. (Of course, it may be unavoidable that, during the this etch process, a small portion (for example, about 1 nm) on either side of layers 216-218 below layer 219 may be etched during this step, as illustrated in FIG. 10, resulting in the remaining portion of layer 219 being slightly wider than the remaining portions of layers 216-218 disposed therebelow). The etchant employed for this step should be selective to the first and second workfunction materials over the high-k material and the sacrificial gap fill material. A suitable etchant includes a wet etchant composed of a mixture of ammonium hydroxide, hydrogen peroxide, and water ($NH_4OH:H_2O_2:H_2O$, commonly referred to in the art as an "SC1" solution—the ratios of the components in the mixture can be adjusted, depending on desired properties of the etch, as is well-known in the art). This etching procedure results in the formation of second and third extended openings 252, 253 being formed on opposite sides of the remaining layers 216-219 above the remaining portions of sidewall spacers 204.

Figure 11:
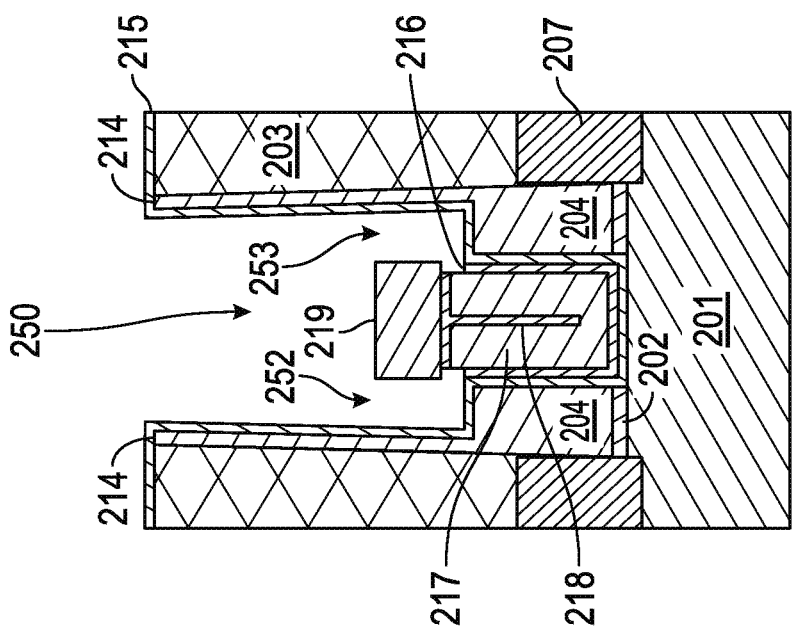

In a subsequent series of etching steps, shown in FIG. 11, both the high-k material layer 215 adjacent to the layer 214 and the sacrificial gap fill material layer 219 are removed. Where the layer 219 is an OPL layer, known OPL etching techniques include reductive "ashing," wherein the semiconductor device is exposed to an elevated temperature (for example greater than about 200° C.) to oxidize the carbon in the OPL material into gaseous oxides of carbon (for example $CO_2$), which dissociate from the device. The high-k material etch will depend on the particular type of high-k material employed. In an exemplary embodiment wherein an oxide of hafnium has been employed for layer 215, a wet etch using an IPA (isopropyl alcohol)/HF solution is suitable. In an alternative embodiment, as noted above, the sacrificial gap fill material layer 219 is a "spin-on" oxide layer, which can be removed in this step using an HF solution.

Figure 12:
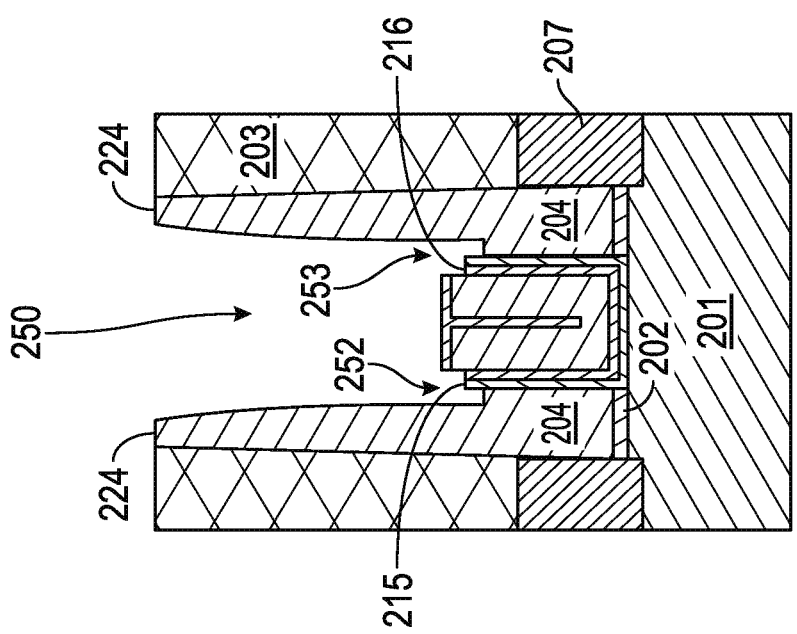

With reference now to FIG. 12, new sidewall spacers 224 may be re-formed above the remaining portions of original sidewall spacers 204. The sidewall spacers 224 are formed from a spacer-forming layer, which itself is formed via the blanket deposition of silicon nitride, silicon oxide, or another suitable dielectric material. The spacer-forming layer is next subjected to a series of etching steps to form sidewall spacers 224. For example, an anisotropic or directional etch is performed to remove selected portions of the spacer-forming layer to thereby create sidewall spacers 224 adjacent opposing sides of the remaining layer 214. In an exemplary embodiment wherein the sidewall spacers 224 and layer 214 are formed of a relatively low-k material such as silicon nitride, SiCN, or SiBCN. The second and third extended openings 252, 253 are somewhat reduced in size by the formation of sidewall spacers 224 of the remaining portions of sidewall spacers 204. However, there remains a space of about 1 nm to about 5 nm in width between the sidewall spacers 224 and the remaining portions of workfunction material layers 216-218 that extend above the remaining portions of sidewall spacers 204.

Figure 13:
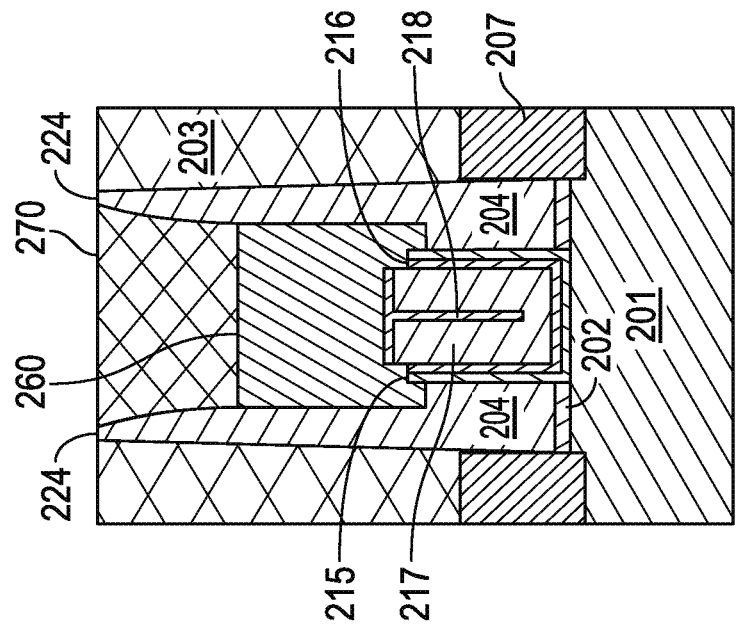

Thereafter, referring now to FIG. 13, a low-resistance material layer 260 is deposited over the workfunction material layer 216-218. The low-resistance material layer 260 is deposited so as to fill the second and third extended openings 252, 253 and a portion of the second opening 255 between sidewall spacers 224. In one embodiment, the low-resistance material layer 260 is a low-resistance tungsten (LRW) material. In other embodiments, layer 260 is a doped amorphous silicon material. The remaining portions of layers 216-218 and the deposited low-resistance material layer form the replacement metal gate.

In accordance with the present disclosure, the first extended opening 251 defines the "real" gate length, which will determine the device performance. However, first extended opening 251 is too small for a work function metal to fill and recess the opening. By implementing a wider, first opening 250 above the first extended opening 251, it becomes possible to recess the workfunction metal by filling additional sacrificial material and etching away the exposed region. The overall gate resistance is also relatively low, because the height of the first extended opening 251 is relatively low, as described above, and the first opening 250 is relatively taller and filled with a low-resistance material.

The method 100 continues with a step 107 of forming a capping layer over the replacement metal gate. With further reference to accompanying FIG. 13, a dielectric capping layer 270 is deposited over the low-resistance material layer 260 of the replacement metal gate. In one embodiment, SiN or SiCN may be employed as the dielectric capping layer 270. The dielectric capping layer 270 fills the remaining portion of the second opening 255, thereby covering the layers exposed therewithin. SiN, in one embodiment, can be deposited using plasma enhanced chemical vapor deposition (PECVD). Thereafter, chemical-mechanical planarization, as is known in the art, can be employed to reduce the height of the depicted structure to a desired thickness for further processing.

Although not illustrated, the illustrated partially-formed integrated circuit is completed in a conventional manner by, for example, providing electrical contacts to the source and drain regions and to the gate electrodes. This conventional processing may include, for example, depositing interlayer dielectrics, etching contact vias, filling the contact vias with conductive plugs, and the like as are well known to those of skill in the art of fabricating semiconductor circuits. Additional post-processing may include the formation of one or more metal layers (M1, M2, etc.) and interlayer dielectric layers therebetween to complete the various electrical connections in the integrated circuit. The present disclosure is not intended to exclude such further processing steps as are necessary to complete the fabrication of the functional integrated circuit.

As such, the subject matter disclosed herein, in one embodiment, includes an integrated circuit fabrication technique for forming a replacement gate structure that has numerous advantages over techniques conventionally employed in the art. For example, the illustrated process flow offers a robust process flow to form a replacement metal gate that is compatible with a self-aligned contact process flow. The presently described process flow offers a method for making replacement gate structures with low resistance when the scale of the gate length is so small that workfunction material layers completely fill the gate structures.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope as set forth in the appended claims and their legal equivalents.

What is claimed is:

1. A method of fabricating an integrated circuit comprising the steps of:
   forming an interlayer dielectric (ILD) layer over a dummy gate stack, the dummy gate stack formed over a semiconductor substrate, the dummy gate stack comprising a dummy gate structure, a hardmask disposed over the dummy gate structure, and sidewall spacers disposed along sides of the dummy gate structure and the hardmask;
   removing at least an upper portion of the dummy gate stack to form a first opening within the ILD layer;
   forming a thin liner along the ILD layer within the first opening;
   extending the first opening to form a first extended opening by completely removing the dummy gate structure of the dummy gate stack, thereby exposing a portion of the semiconductor substrate;
   depositing at least one workfunction material layer within the first opening and within the first extended opening;
   removing portions of the at least one workfunction material within the first opening; and depositing a low-resistance material over a remaining portion of the at least one workfunction material, thereby forming a replacement metal gate structure comprising the remaining portion of the at least one workfunction material and the low-resistance material.

2. The method of claim 1, further comprising forming a capping layer over the replacement metal gate structure.

3. The method of claim 1, wherein removing at least the upper portion of the dummy gate stack comprises removing the hardmask and removing a portion of the sidewall spacers.

4. The method of claim 1, wherein forming the thin liner comprises conformally depositing the liner within the opening followed by removing the liner from remaining portions of the sidewall spacers and the dummy gate structure.

5. The method of claim 1, wherein forming the thin liner comprises forming a thin silicon nitride liner.

6. The method of claim 1, wherein depositing at least one workfunction material layer comprises depositing a workfunction metal layer that is thicker than half width of second opening.

7. The method of claim 6, wherein depositing at least one workfunction material layer comprises depositing a first layer of the first workfunction material, a first layer of a second workfunction material over the first layer of the first layer of the first workfunction material, and a second layer of the first workfunction material over the first layer of the second workfunction material.

8. The method of claim 1, further comprising depositing a barrier material layer prior to depositing the at least one workfunction material layer.

9. The method of claim 1, further comprising removing the thin liner prior to depositing the at least one workfunction material layer.

10. The method of claim 1, wherein removing portions of the at least one workfunction material comprises removing portions of the workfunction material that are adjacent to the ILD layer and that are above remaining portions of the sidewall spacers.

11. The method of claim 10, further comprising depositing a sacrificial layer in the first opening prior to removing the portions of the workfunction material.

12. The method of claim 11, further comprising removing the sacrificial layer subsequent to removing the portions of the workfunction material.

13. The method of claim 1, further comprising re-forming at least of portion of the sidewall spacers subsequent to removing the portions of the at least one workfunction material.

14. The method of claim 1, wherein depositing the at least one workfunction material comprises depositing a p-type workfunction material.

15. The method of claim 1, wherein depositing the at least one workfunction material comprises depositing an n-type workfunction material.

16. A method of fabricating an integrated circuit comprising the steps of:
- forming an interlayer dielectric (ILD) layer over a dummy gate stack, the dummy gate stack formed over a semiconductor substrate and a dummy oxide layer formed over the semiconductor substrate, the dummy gate stack comprising a dummy gate structure, a hardmask disposed over the dummy gate structure, and sidewall spacers disposed along sides of the dummy gate structure and the hardmask and over the dummy oxide layer;
- removing at least an upper portion of the dummy gate stack to form a first opening within the ILD layer, wherein removing at least the upper portion comprises removing the hardmask and portions of the sidewall spacers adjacent to the hardmask;
- forming a thin silicon nitride liner along the ILD layer within the first opening;
- extending the first opening to form a first extended opening by completely removing the dummy gate structure of the dummy gate stack and a portion of the dummy oxide layer disposed thereunder, thereby exposing a portion of the semiconductor substrate;
- depositing a layer of a first workfunction material and a layer of a second workfunction material within the first opening and within the first extended opening;
- depositing an organic planarization layer within the first opening;
- removing portions of the first and second workfunction material layers within the first opening, using the organic planarization layer as an etch mask;
- removing the organic planarization layer;
- re-forming a portion of the sidewall spacers;
- depositing a low-resistance tungsten material over a remaining portion of the workfunction material layers and in between the re-formed portion of the sidewall spacers, thereby forming a replacement metal gate structure comprising the remaining portion of the workfunction material and the low-resistance material; and
- forming a capping layer over the replacement metal gate structure.

* * * * *